United States Patent
Chu (10) Patent No.: US 11,482,994 B2
(45) Date of Patent: Oct. 25, 2022

(54) CURRENT STEERING COMPARATOR AND CAPACITOR CONTROL METHOD

(71) Applicant: REALTEK SEMICONDUCTOR CORPORATION, Hsinchu (TW)

(72) Inventor: Jung-Hsin Chu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/546,079

(22) Filed: Dec. 9, 2021

(65) Prior Publication Data

US 2022/0200588 A1 Jun. 23, 2022

(30) Foreign Application Priority Data

Dec. 17, 2020 (TW) ................................. 109144639

(51) Int. Cl.
  *H03K 5/22* (2006.01)
  *H03K 5/24* (2006.01)
  *H03K 19/20* (2006.01)
  *H03F 3/04* (2006.01)
  *H03K 3/037* (2006.01)

(52) U.S. Cl.
  CPC ............. *H03K 5/24* (2013.01); *H03F 3/04* (2013.01); *H03K 3/037* (2013.01); *H03K 19/20* (2013.01)

(58) Field of Classification Search
  CPC ............. G01R 19/0038; H03K 5/2418; H03K 5/2445; H03K 5/2481
  USPC .......................................................... 327/65
  See application file for complete search history.

(56) References Cited

U.S. PATENT DOCUMENTS

| 8,922,405 B2 | 12/2014 | Lin et al. |
| 8,957,706 B2 * | 2/2015 | Chen ................. H03K 5/22 327/55 |
| 2019/0214977 A1 * | 7/2019 | Verdant ............... H03K 5/2481 |

FOREIGN PATENT DOCUMENTS

| CN | 110034765 B | * | 6/2021 | ............. H03M 1/44 |
| WO | WO-2018085972 A1 | * | 5/2018 | ............. G01D 5/24 |

OTHER PUBLICATIONS

U. Chio, S. Sin, U. Seng-Pan, F. Maloberti and R. P. Martins, "A 5-bit 2 GS/s binary-search ADC with charge-steering comparators," 2017 IEEE Asian Solid-State Circuits Conference (A-SSCC), 2017, pp. 221-224, doi: 10.1109/ASSCC.2017.8240256.

(Continued)

Primary Examiner — Quan Tra
(74) Attorney, Agent, or Firm — WPAT, PC (57) ABSTRACT

A current steering comparator includes an amplifier circuit, a bias circuit, a latch circuit, and a detector circuit. The amplifier circuit is configured to compare a first input signal with a second input signal during a comparison phase, in order to output a first signal and a second signal. The bias circuit is configured to utilize a tunable capacitor to bias the amplifier circuit during the comparison phase. The latch circuit is configured to generate a first output signal and a second output signal according to the first signal and the second signal during the comparison phase. The detector circuit is configured to detect the first output signal and the second output signal according to a predetermined clock signal to generate a control signal, in order to adjust the tunable capacitor.

20 Claims, 4 Drawing Sheets

(56) References Cited

OTHER PUBLICATIONS

H. S. Bindra, C. E. Lokin, D. Schinkel, A. Annema and B. Nauta, "A 1.2-V Dynamic Bias Latch-Type Comparator in 65-nm CMOS With 0.4-mV Input Noise," in IEEE Journal of Solid-State Circuits, vol. 53, No. 7, pp. 1902-1912, Jul. 2018, doi: 10.1109/JSSC.2018.2820147.
OA letter of the counterpart TW application (appl. No. 109144639) dated May 31, 2021. Summary of the OA letter: 1. The feature of "current-steering comparator" in paragraphs [0001], [0003], [0004], [0006], and so on, of the specification is allegedly being unclear and insufficient to be carried out by person ordinarily skilled in the art in view of Fig. 3 of cited reference 1 (Mostafa Ayesh et. al. "A Low-Power 20-Gb/s Discrete-Time Analog Front-End for ADC-Based Serial Link Equalizers" https://arxiv.org/abs/1902.00233v1). 2. Claims 1-10 are allowable. Correspondence bewteen claims of TW counterpart application and claims of US application: 1. Claims 1-10 in TW counterpart application correspond to claims 1-9 and 12 in US application, respectively.
Ayesh, Mostafa, Sameh Ibrahim, and Mohamed M. Aboudina. "A Low-Power 20-Gb/s Discrete-Time Analog Front-End for ADC-Based Serial Link Equalizers," arXiv preprint arXiv:1902.00233 (2019).

* cited by examiner

Bias, by bias circuit having tunable capacitor, amplifier circuit in current steering comparator during comparison phase, in which amplifier circuit compares first input signal with second input signal during comparison phase to output a first signal and a second signal, and latch circuit in the current steering comparator generates first output signal and second output signal according to first signal and second signal during comparison phase ~S410

Detect first output signal and second output signal according to predetermined clock signal to generate control signal, in order to adjust tunable capacitor ~S420

Fig. 4

CURRENT STEERING COMPARATOR AND CAPACITOR CONTROL METHOD

BACKGROUND OF THE INVENTION

1. Field of the Invention

The present disclosure relates to a comparator circuit. More particularly, the present disclosure relates to a current steering comparator having dynamic biasing and a capacitor control method.

2. Description of Related Art

A comparator circuit is commonly employed in a quantizer to convert an analog to a digital signal. In order to achieve high resolution, the comparator circuit is required to have better noise performance In order to achieve higher conversion rate, the comparator circuit is required to have higher operating speed. However, in existing comparator circuit(s), the noise performance is inversely proportional to the operating speed. Moreover, because of process variation, voltage variation, and/or temperature variation, a level of the comparator circuit is not easy to be accurately controlled, which results in a difficulty of setting the actual performance of the comparator circuit.

SUMMARY

In some aspects, a current steering comparator includes an amplifier circuit, a bias circuit, a latch circuit, and a detector circuit. The amplifier circuit is configured to compare a first input signal with a second input signal during a comparison phase, in order to output a first signal and a second signal. The bias circuit is configured to utilize a tunable capacitor to bias the amplifier circuit during the comparison phase. The latch circuit is configured to generate a first output signal and a second output signal according to the first signal and the second signal during the comparison phase. The detector circuit is configured to detect the first output signal and the second output signal according to a predetermined clock signal to generate a control signal, in order to adjust the tunable capacitor.

In some aspects, a capacitor control method includes the following operations: biasing, by a bias circuit having a tunable capacitor, an amplifier circuit in a current steering comparator during a comparison phase, in which the amplifier circuit compares a first input signal with a second input signal to output a first signal and a second signal, and a latch circuit in the current steering comparator generates a first output signal and a second output signal according to the first signal and the second signal during the comparison phase; and detecting the first output signal and the second output signal according to a predetermined clock signal to generate a control signal, in order to adjust the tunable capacitor.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
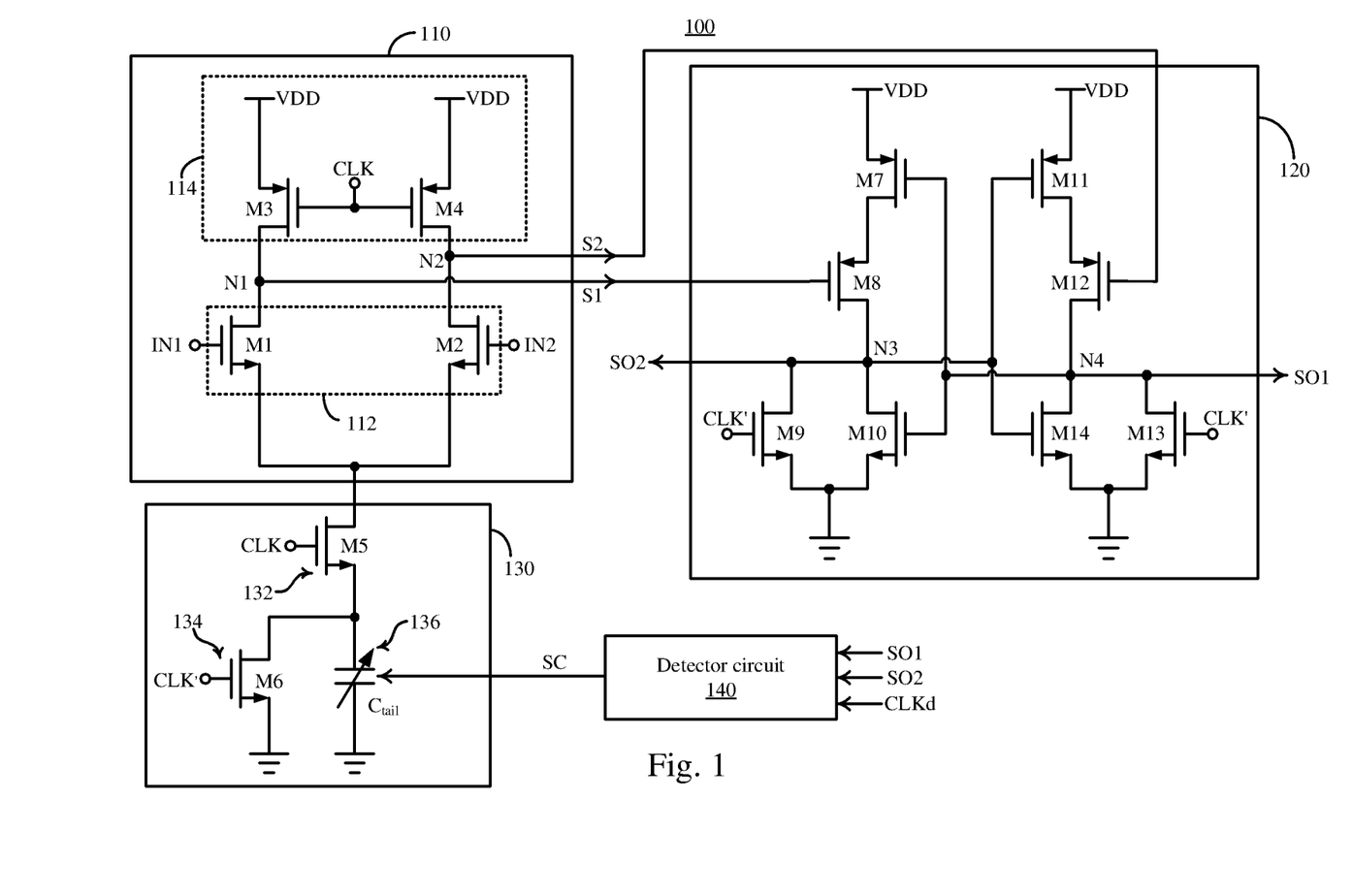
FIG. 1 is a schematic diagram of a current steering comparator according to some embodiments of the present disclosure.

FIG. 1 is a schematic diagram of a current steering comparator 100 according to some embodiments of the present disclosure. In some embodiments, the current steering comparator 100 may be applied to various circuitries (which may include, but not limited to, a digital to analog converter circuitry and an analog to digital converter circuitry).

The current steering comparator 100 includes an amplifier circuit 110, a latch circuit 120, a bias circuit 130, and a detector circuit 140. The amplifier circuit 110 is configured to compare an input signal IN1 with an input signal IN2 during a comparison phase, in order to generate a signal S1 and a signal S2. The latch circuit 120 is configured to generate an output signal SO1 and an output signal SO2 according to the signal S1 and the signal S2 during the comparison phase. The bias circuit 130 has a tunable capacitor $C_{tail}$, which may be configured to lower noise(s) of the amplifier circuit 110. The bias circuit 130 is configured to utilize the tunable capacitor $C_{tail}$ to bias the amplifier circuit 110 during the comparison phase. In some embodiments, the comparison phase may be an interval of the clock signal CLK being at a high level.

In greater detail, the amplifier circuit 110 may include an input pair circuit 112 and a reset circuit 114. The input pair circuit 112 is configured to compare the input signal IN1 with the input signal IN2 during the comparison phase, in order to output the signal S1 via a node N1, and output the signal S2 via a node N2. The reset circuit 114 is configured to adjust a level of the node N1 to a predetermined level (e.g., a voltage VDD) and adjust a level of the node N2 to the predetermined level during a reset phase. In some embodiments, the reset phase may be an interval of the clock signal CLK being at a low level.

For example, the input pair circuit 112 includes a transistor M1 and a transistor M2. A control terminal (e.g., gate) of the transistor M1 receives the input signal IN1. A first terminal (e.g., drain) of the transistor M1 is coupled to the node N1. A second terminal (e.g., source) of the transistor M1 is coupled to the bias circuit 130. A control terminal of the transistor M2 receives the input signal IN2. A first terminal of the transistor M2 is coupled to the node N2. A second terminal of the transistor M2 is coupled to the bias circuit 130. The reset circuit 114 includes a transistor M3 and a transistor M4. A first terminal (e.g., source) of the transistor M3 and a first terminal of the transistor M4 receive the voltage VDD. A second terminal (e.g., drain) of the transistor M3 is coupled to the node N1, and a second terminal of the transistor M4 is coupled to the node N2. A control terminal of the transistor M3 and a control terminal of the transistor M4 receive the clock signal CLK.

During the reset phase (e.g., the interval of the clock signal CLK being at the low level), the transistor M3 and the transistor M4 are turned on, in order to transmit the voltage VDD to the node N1 and the node N2. Under this condition, the level of the node N1 and the level of the node N2 are reset to the voltage VDD. During the comparison phase (e.g., the interval of the clock signal CLK being at the high level), the transistor M3 and the transistor M4 are not turned on. Under this condition, according to the input signal IN1 and the input signal IN2, the transistor M1 and the transistor M2 may pull down the level of one of the node N1 and the node N2, and keep the level of another one of the node N1 and the node N2, in order to generate the signal S1 and the signal S2.

The bias circuit 130 includes a switch 132, a switch 134, and a capacitor array circuit 136. The switch 132 is coupled between the input pair circuit 112 and the capacitor array circuit 136, and is configured to be turned on during the comparison phase. The switch 134 is configured to be turned on during the reset phase, in order to discharge the capacitor array circuit 136. The capacitor array circuit 136 is configured to provide the tunable capacitor $C_{tail}$, in which the capacitance value of the tunable capacitor $C_{tail}$ may be adjusted according to the control signal SC.

For example, the switch 132 may be (but not limited to) implemented with a transistor M5, and the switch 134 may be (but not limited to) implemented a transistor M6. A first terminal of the transistor M5 is coupled to the second terminals of the transistor M1 and the transistor M2. A second terminal of the transistor M5 is coupled to the capacitor array circuit 136. A control terminal of the transistor M5 receives the clock signal CLK. A first terminal of the transistor M6 is coupled to the second terminal of the transistor M5. A second terminal of the transistor M6 is coupled to ground. A control terminal the transistor M6 receives a clock signal CLK'. The clock signal CLK' and the clock signal CLK are different in phase by about 180 degrees. In other words, if the clock signal CLK has the high level, the clock signal CLK' has the low level. If the clock signal CLK has the low level, the clock signal CLK' has the high level.

During the interval of the clock signal CLK being at the low level (i.e., the reset phase), the transistor M6 is turned on, in order to discharge the capacitor array circuit 136. Under this condition, the voltage on the tunable capacitor $C_{tail}$ is a ground voltage. During the reset phase, the transistor M3 and the transistor M4 are turned on, in order to charge parasitic capacitors (not shown) coupled to the node N1 and the node N2. During the interval of the clock signal CLK having the high level (i.e., the comparison phase), the transistor M5 is turned on and the transistor M6 is not turned on. As a result, the parasitic capacitors coupled to the node N1 and the node N2 are discharged to charge the tunable capacitor $C_{tail}$. Under this condition, the voltage on the tunable capacitor $C_{tail}$ is increased, in order to lower a gate-source voltage of the transistor M1 and that of the transistor M2. Equivalently, the tunable capacitor $C_{tail}$ may provide a dynamic bias to the input pair circuit 112 during the comparison phase. With the above biasing, an input referred noise of the amplifier circuit 110 can be lower. Generally, if the capacitance value of the tunable capacitor $C_{tail}$ is lower, the input referred noise of the amplifier circuit 110 is lower. However, if the capacitance value is too low, the operating speed of the latch circuit 120 is slower. As described below, with the detector circuit 140, the capacitance value of the tunable capacitor $C_{tail}$ may achieve a better balance between the operating speed and the noise performance The latch circuit 120 includes transistors M7-M14. The transistors M7-M8, M10-M12, and M14 form a positive feedback circuit, which is configured to generate the output signal SO1 and the output signal SO2 according to the signal S1 and the signal S2. The transistor M9 and the transistor M13 reset the levels of the node N3 and the node N4 during the reset phase. For example, during the reset phase, the transistor M9 and the transistor M13 are turned on according to the clock signal CLK', in order to pull down the levels of the node N3 and the node N4 to ground. During the comparison phase, if the signal S1 has the high level and the signal S2 has the low level, the transistor M8 is not turned on and the transistor M12 is turned on. Under this condition, the level of the node N4 is pulled up to the voltage VDD, in order to output the output signal SO1 having the high level. In response to the level of the node N4, the transistor M7 is not turned on and the transistor M10 is turned on to pull down the level of the node N3 to ground, in order to output the output signal SO2 having the low level.

The above arrangements about the amplifier circuit 110, the latch circuit 120, and the bias circuit 130 are given for illustrative purposes, and the present disclosure is not limited thereto. In some embodiments, the transistors M1, M2, M5, M6, M9, M10, M13 and M14 may be N-type transistors, and the transistors M3, M4, M7, M8, M11, and M12 may be P-type transistors. In some embodiments, each transistor may be implemented with metal oxide semiconductor field effect transistors (MOSFETs), but the present disclosure is not limited thereto. Various types of transistors able to implement the similar operations are within the contemplated scope of the present disclosure.

The detector circuit 140 is configured to detect the output signal SO1 and the output signal SO2 according to the predetermined the predetermined clock signal CLKd, in order to generate a control signal SC. In some embodiments, the detector circuit 140 may detect the output signal SO1 and the output signal SO2 during a predetermined interval (e.g., predetermined interval T in FIG. 3B) after the amplifier circuit 110 enters the comparison phase according to the clock signal CLK, in order to determine whether the operating speed of the amplifier circuit 110 and the latch circuit 120 meets a predetermined requirement. If the operating speed does not meet the predetermined requirement, the detector circuit 140 may output the corresponding control signal SC, in order to adjust the capacitance value of the tunable capacitor $C_{tail}$. By adjusting the capacitance value of the tunable capacitor $C_{tail}$, it is able to adjust the operating speed of both of the amplifier circuit 110 and the latch circuit 120.

In some related approaches, a capacitor having a fixed capacitance value is employed to implement a bias circuit. In these approaches, because of process variation, voltage variation, and/or temperature variation, offset(s) may exist in the threshold voltage of transistors (e.g., the transistors M1 and M2) in an input pair circuit and a supply voltage (e.g., the voltage VDD). As a result, the capacitance value of the capacitor and a level of an internal node (e.g., the node N1 and the node N2) in a comparator circuit cannot be controlled accurately, which results in operation failure or impacts on operation(s) of subsequent circuit(s) (e.g., the latch circuit 120). Compared with the above related approaches, in some embodiments of the present disclosure, with the capacitor array circuit 136, the detector circuit 140 may determine the operating speed of the amplifier circuit 110 and the latch circuit 120 according to the output signal SO1 and the output signal SO. If the operating speed does not meet the predetermined requirement, the detector circuit 140 may output the control signal SC, in order to adjust the capacitance value of the tunable capacitor $C_{tail}$. As a result, under impacts from process variation, voltage variation, and/or the temperature variation, the performance of the current steering comparator 100 is able to meet the predetermined requirement.

Figure 2:
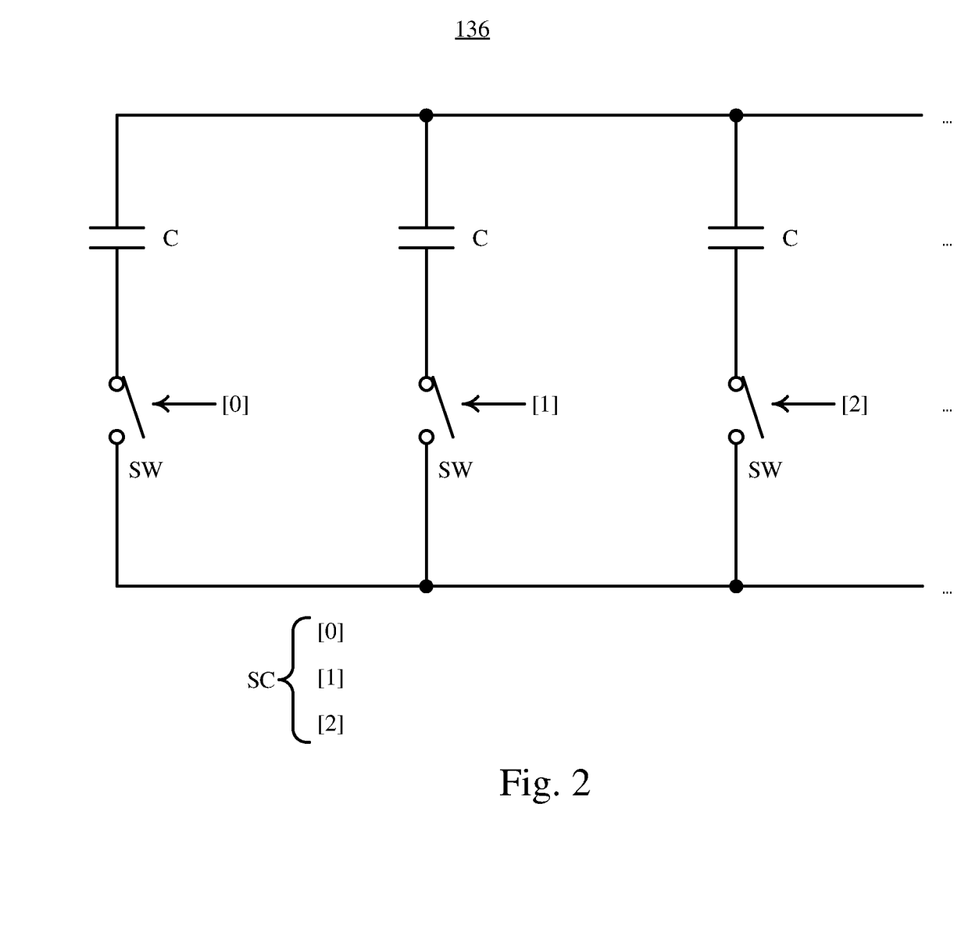
FIG. 2 is a schematic diagram of the capacitor array circuit in FIG. 1 according to some embodiments of the present disclosure.

FIG. 2 is a schematic diagram of the capacitor array circuit 136 in FIG. 1 according to some embodiments of the present disclosure. The capacitor array circuit 136 includes capacitors C and switches SW. The switches SW are respectively coupled to the capacitors C, and are selectively turned on according to the control signal SC. For example, the first switch SW receives a first bit [0] in the control signal SC, the second switch SW receives a second bit [1] in the control signal SC, and the third switch SW receives a third bit [2] in the control signal SC. With this analogy, it is understood the corresponding relation between the switches SW and bits in the control signal SC.

In examples of FIG. 1, as the transistor M8 and the transistor M12 are P-type transistors, the level of the node N1 and the level of the node N2 will affect the operating speed of the latch circuit 120 directly. For example, if the level of the node N1 is lower, a driving current of the transistor M8 is higher, which results in higher operating speed. Alternatively, if the level of node N1 is higher, the driving current of the transistor M8 is lower, which results in lower operating speed. If the detector circuit 140 detects that the operating speed of the amplifier circuit 110 and the latch circuit 120 is too slow, the detector circuit 140 may output a corresponding control signal SC, in order to turn on more the switches SW (i.e., a number of switches SW being closed (i.e., a conducting state) is higher). Under this condition, the capacitance value of the tunable capacitor $C_{tail}$ is increased, in order to lower the level of the node N1 and the level of the node N2. As a result, the operating speed of the latch circuit 120 can be increased. Alternatively, if the detector circuit 140 determines that the operating speed is too fast, the detector circuit 140 may output the corresponding control signal SC, in order to turn off more the switches SW (i.e., a number of switches SW being open (i.e., a non-conducting state) is higher). Under this condition, the capacitance value of the tunable capacitor $C_{tail}$ is decreased, in order to lower the level of the node N1 and the level of the node N2. As a result, the operating speed of the latch circuit 120 can be decreased.

Figure 3A:
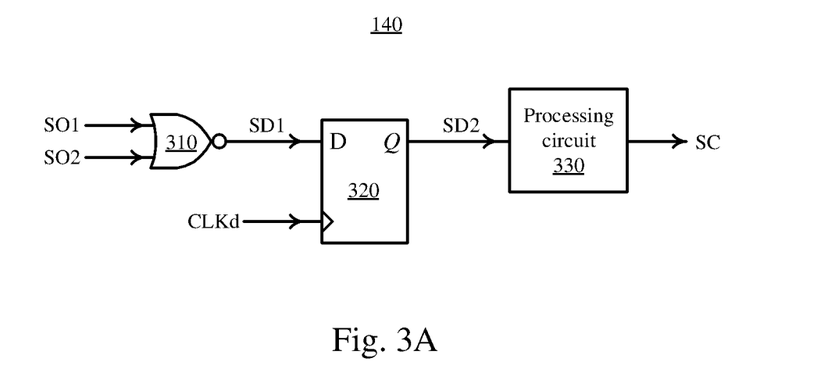
FIG. 3A is a schematic diagram of the detector circuit in FIG. 1 according to some embodiments of the present disclosure.
Figure 3B:
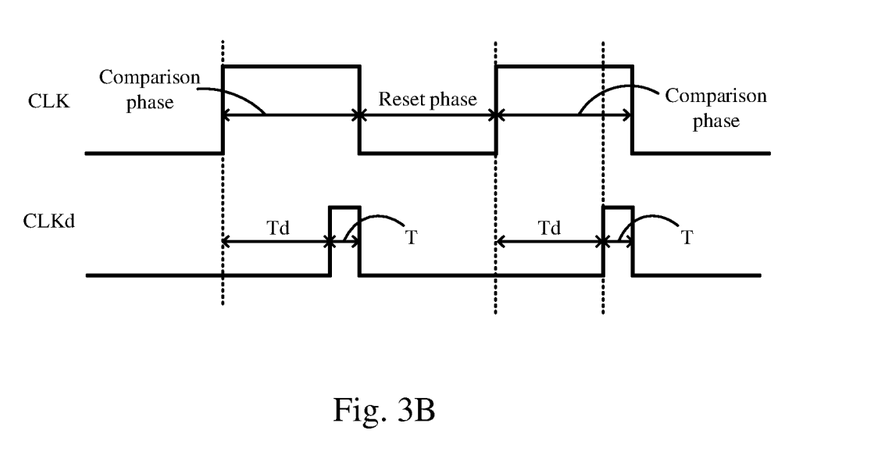
FIG. 3B is a waveform diagram of the clock signal and the predetermined clock signal in FIG. 1 according to some embodiments of the present disclosure.

FIG. 3A is a schematic diagram of the detector circuit 140 in FIG. 1 according to some embodiments of the present disclosure, and FIG. 3B is a waveform diagram of the clock signal CLK and the predetermined clock signal CLKd in FIG. 1 according to some embodiments of the present disclosure. The detector circuit 140 includes a logic gate circuit 310, a flip flop circuit 320, and a processing circuit 330. the logic gate circuit 310 is configured to generate a detection signal SD1 according to the output signal SO1 and the output signal SO2. In examples of FIG. 3A, the logic gate circuit 310 may be a NOR gate circuit. In other embodiments, according to the arrangements of the amplifier circuit 110, the logic gate circuit 310 may be (but not limited to) a XOR gate circuit, a NAND gate circuit, and so on. As described above, during the reset phase, the level of the node N3 and the level of the node N4 are reset to the ground voltage. Therefore, during the reset phase, the logic gate circuit 310 may output the detection signal SD1 having a logic value of 1. If the amplifier circuit 110 and the latch circuit 120 are able to generate the comparison result during the comparison phase, according to different comparison results, one of the node N3 and the node N4 has the high level (i.e., one of the output signal SO1 and the output signal SO2 has the high level), and another one of the node N3 and the node N4 has the low level (i.e., another one of the output signal SO1 and the output signal SO2 has the low level). In response to the output signal SO1 and the output signal SO2, the logic gate circuit 310 may output the detection signal SD1 having a logic value of 0. Alternatively, if the amplifier circuit 110 and the latch circuit 120 cannot generate the comparison result during the comparison phase, the logic gate circuit 310 still outputs the detection signal SD1 having the logic value of 1.

The flip flop circuit 320 is configured to output to the detection signal SD1 to be a detection signal SD2 according to the predetermined clock signal CLKd. The flip flop circuit 320 may output the detection signal SD1 to be the detection signal SD2 during a predetermined interval T after the amplifier circuit 110 enters the comparison phase. For example, as shown in FIG. 3B, a delay time Td is between a transiting edge (which may be, for example but not limited to, a rising edge) of the clock signal CLK and a transiting edge (which may be, for example but not limited to, a rising edge) of the predetermined clock signal CLKd. The flip flop circuit 320 may be (but not limited to) a D-type flip flop circuit, which may output the detection signal SD1 to be the detection signal SD2 according to the rising edge of the predetermined clock signal CLKd.

The processing circuit 330 is configured to determine whether the operating speed of the amplifier circuit 110 and the latch circuit 120 meets the predetermined requirement according to the detection signal SD2, in order to generate the control signal SC. For example, if the detection signal SD2 has the logic value of 0, it indicates that the amplifier circuit 110 and the latch circuit 120 cannot generate the comparison result during the comparison phase (i.e., the operating speed of the amplifier circuit 110 and the latch circuit 120 is too slow and does not meet the predetermined requirement). Under this condition, the processing circuit 330 may output the corresponding control signal SC to increase the capacitance value of the tunable capacitor $C_{tail}$, in order to increase the operating speed. Alternatively, if the detection signal SD2 is the logic value of 1, in indicates that the amplifier circuit 110 and the latch circuit 120 are able to generate the comparison result during the comparison phase (i.e., the operating speed of the amplifier circuit 110 and the latch circuit 120 meets the predetermined requirement). Under this condition, the processing circuit 330 may output the corresponding control signal SC to decrease the capacitance value of the tunable capacitor $C_{tail}$. As a result, the noises of the amplifier circuit 110 can be further decreased. By repeatedly performing the above operations, the capacitance value of the tunable capacitor $C_{tail}$ may have a better balance between the operating speed and the noise performance under process variation, voltage variation, and/or temperature variation. In some embodiments, the processing circuit 330 may be implemented with a microcontroller circuit, a digital signal processor circuit, or a digital circuit having a processing ability. In some embodiments, the predetermined requirement may be determined according to practical applications of the current steering comparator 100. For example, when the current steering comparator 100 is applied to an analog to digital converter, the predetermined requirement may be determined according to a conversion time of the analog to digital converter.

Figure 4:
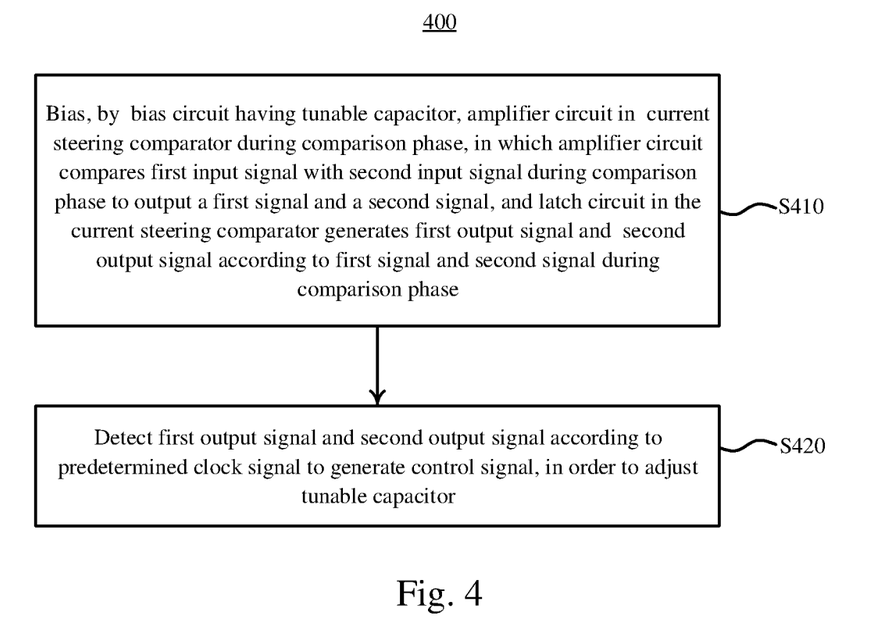
FIG. 4 is a flow chart a capacitor control method according to some embodiments of the present disclosure.

FIG. 4 is a flow chart a capacitor control method 400 according to some embodiments of the present disclosure. In some embodiments, the capacitor control method 400 may be configured to (but not limited to) adjust a tunable capacitor in a comparator circuit.

In operation S410, an amplifier circuit (e.g., the amplifier circuit 110 in FIG. 1) in a current steering comparator is biased by a bias circuit (e.g., the bias circuit 130 in FIG. 1) having a tunable capacitor during a comparison phase, in which the amplifier circuit compares a first input signal with a second input signal during the comparison phase to output a first signal and a second signal, and a latch circuit (e.g., the latch circuit 120 in FIG. 1) in the current steering comparator generates a first output signal and a second output signal according to the first signal and the second signal during the comparison phase. In operation S420, the first output signal and the second output signal are detected according to a predetermined clock signal to generate a control signal, in order to adjust the tunable capacitor.

The above operations can be understood with reference to the above embodiments, and thus the repetitious descriptions are not further given. The above description of the capacitor control method 400 includes exemplary operations, but the operations of the capacitor control method 400 are not necessarily performed in the order described above. Operations of the capacitor control method 400 can be added, replaced, changed order, and/or eliminated, or the operations of the capacitor control method 400 can be executed simultaneously or partially simultaneously as appropriate, in accordance with the spirit and scope of various embodiments of the present disclosure.

As described above, the current steering comparator and the capacitor control method in some embodiments of the present disclosure are able to accurately adjust the capacitance value of the tunable capacitor in the comparator under process variation, voltage variation, and/or temperature variation, in order to achieve a better balance between the noise performance and the operating speed.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A current steering comparator, comprising:
    an amplifier circuit configured to compare a first input signal with a second input signal during a comparison phase, in order to output a first signal and a second signal;
    a bias circuit configured to utilize a tunable capacitor to bias the amplifier circuit during the comparison phase;
    a latch circuit configured to generate a first output signal and a second output signal according to the first signal and the second signal during the comparison phase; and
    a detector circuit configured to detect the first output signal and the second output signal according to a predetermined clock signal to generate a control signal, in order to adjust the tunable capacitor.

2. The current steering comparator of claim 1, wherein the detector circuit is configured to detect the first output signal and the second output signal during a predetermined interval after the amplifier circuit enters the comparison phase.

3. The current steering comparator of claim 1, wherein the amplifier circuit is configured to enter the comparison phase according to a clock signal, and a delay time is between a transiting edge of the clock signal and a transiting edge of the predetermined clock signal.

4. The current steering comparator of claim 1, wherein the amplifier circuit comprises:
    a reset circuit configured to adjust a level of a first node to a predetermined level and adjust a level of a second node to the predetermined level during a reset phase; and
    an input pair circuit configured to compare the first input signal with the second input signal, in order to output the first signal via the first node and output the second signal via the second node.

5. The current steering comparator of claim 4, wherein the bias circuit comprises:
    a capacitor array circuit configured to provide the tunable capacitor;
    a first switch coupled between the input pair circuit and the capacitor array circuit, and configured to be turned on during the comparison phase; and a second switch configured to be turned on during the reset phase, in order to discharge the capacitor array circuit.

6. The current steering comparator of claim 5, wherein the capacitor array circuit comprises:
   a plurality of capacitors; and
   a plurality of third switches coupled to the plurality of capacitors respectively, and configured to be selectively turned on according to the control signal.

7. The current steering comparator of claim 1, wherein the detector circuit comprises:
   a logic gate circuit configured to generate a first detection signal according the first output signal and the second output signal;
   a flip flop circuit configured to output the first detection signal to be a second detection signal according to the predetermined clock signal; and
   a processing circuit configured to determine whether an operating speed of the amplifier circuit and the latch circuit meets a predetermined requirement according to the second detection signal, in order to generate the control signal.

8. The current steering comparator of claim 7, wherein the flip flop circuit outputs the second detection signal during a predetermined interval after the amplifier circuit enters the comparison phase.

9. The current steering comparator of claim 7, wherein if the operating speed does not meet the predetermined requirement, the processing circuit outputs the control signal to increase a capacitance value of the tunable capacitor.

10. The current steering comparator of claim 7, wherein if the operating speed meets the predetermined requirement, the processing circuit is configured to output the control signal, in order to decrease a capacitance value of the tunable capacitor.

11. The current steering comparator of claim 7, wherein the logic gate circuit is a NOR gate circuit.

12. A capacitor control method, comprising:
   biasing, by a bias circuit having a tunable capacitor, an amplifier circuit in a current steering comparator during a comparison phase, wherein the amplifier circuit compares a first input signal with a second input signal to output a first signal and a second signal, and a latch circuit in the current steering comparator generates a first output signal and a second output signal according to the first signal and the second signal during the comparison phase; and
   detecting the first output signal and the second output signal according to a predetermined clock signal to generate a control signal, in order to adjust the tunable capacitor.

13. The capacitor control method of claim 12, wherein detecting the first output signal and the second output signal according to the predetermined clock signal to generate the control signal, in order to adjust the tunable capacitor comprises:
   detecting the first output signal and the second output signal during a predetermined interval after the amplifier circuit enters the comparison phase.

14. The capacitor control method of claim 12, wherein the amplifier circuit is configured to enter the comparison phase according to a clock signal, and a delay time is between a transiting edge of the clock signal and a transiting edge of the predetermined clock signal.

15. The capacitor control method of claim 12, wherein detecting the first output signal and the second output signal according to the predetermined clock signal to generate the control signal, in order to adjust the tunable capacitor comprises:
   generating, by a logic gate circuit, a first detection signal according the first output signal and the second output signal;
   outputting, by a flip flop circuit, the first detection signal to be a second detection signal according to the predetermined clock signal; and
   determining whether an operating speed of the amplifier circuit and the latch circuit meets a predetermined requirement according to the second detection signal, in order to generate the control signal.

16. The capacitor control method of claim 15, wherein the flip flop circuit outputs the second detection signal during a predetermined interval after the amplifier circuit enters the comparison phase.

17. The capacitor control method of claim 15, wherein determining whether the operating speed of the amplifier circuit and the latch circuit meets the predetermined requirement according to the second detection signal, in order to generate the control signal comprises:
   if the operating speed does not meet the predetermined requirement, outputting the control signal to increase a capacitance value of the tunable capacitor.

18. The capacitor control method of claim 15, wherein determining whether the operating speed of the amplifier circuit and the latch circuit meets the predetermined requirement according to the second detection signal, in order to generate the control signal comprises:
   if the operating speed meets the predetermined requirement, outputting the control signal to decrease a capacitance value of the tunable capacitor.

19. The capacitor control method of claim 15, wherein the logic gate circuit is a NOR gate circuit.

20. The capacitor control method of claim 12, wherein the tunable capacitor is provided by a capacitor array circuit.

* * * * *